US006777168B2

(12) United States Patent
Cauchi

(10) Patent No.: US 6,777,168 B2
(45) Date of Patent: Aug. 17, 2004

(54) MULTIPLE PHOTOLITHOGRAPHIC EXPOSURES WITH DIFFERENT CLEAR PATTERNS

(75) Inventor: John Cauchi, Sunnyvale, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 110 days.

(21) Appl. No.: 10/020,452

(22) Filed: Dec. 4, 2001

(65) Prior Publication Data

US 2003/0113674 A1 Jun. 19, 2003

(51) Int. Cl.[7] .................................................. G03F 7/20
(52) U.S. Cl. ........................ 430/311; 430/394; 430/396
(58) Field of Search ................................. 430/311, 312, 430/313, 322, 22, 394, 396

(56) References Cited

U.S. PATENT DOCUMENTS

| | | | | |
|---|---|---|---|---|
| 5,407,785 A | * | 4/1995 | Leroux | 430/312 |
| 5,631,112 A | | 5/1997 | Tsai et al. | 430/22 |
| 5,663,893 A | | 9/1997 | Wampler et al. | 364/491 |
| 5,863,712 A | | 1/1999 | Von Bunau et al. | 430/396 |
| 6,280,887 B1 | | 8/2001 | Lu | 430/5 |
| 6,301,008 B1 | | 10/2001 | Ziger et al. | 356/401 |
| 6,311,319 B1 | | 10/2001 | Tu et al. | 716/19 |

OTHER PUBLICATIONS

Handbook of Microlithography, Micromachining, and Microfabrication; vol. 1: Microlithography, Editor P. Rai–Choudhury; (1997), p. 79.

* cited by examiner

*Primary Examiner*—Kathleen Duda
(74) *Attorney, Agent, or Firm*—Michael Shenker; MacPherson Kwok Chen & Heid LLP

(57) ABSTRACT

A photoresist layer is exposed two or more times. At least one exposure is conducted through a regular mask, and at least one exposure through a modified mask with a clear region overlapping the position of a non-clear region of the first mask. The radiation dose used with the modified mask is insufficient by itself to create a resist pattern on the substrate. The exposure through the modified mask alleviates the resist underexposure in concave corners of the opaque pattern of the regular mask. Instead of the modified mask, an exposure without a mask can be performed.

18 Claims, 5 Drawing Sheets

MULTIPLE PHOTOLITHOGRAPHIC EXPOSURES WITH DIFFERENT CLEAR PATTERNS

BACKGROUND OF THE INVENTION

The present invention relates to photolithography.

Photolithography is widely used to form patterns on semiconductor wafers in fabrication of integrated circuits. A wafer 110 (FIG. 1) is coated with a photoresist layer 120. Photoresist 120 is irradiated from a light source 130. A mask or reticle 140 is placed between source 130 and resist 120. Mask 140 carries a pattern consisting of opaque and clear features. This pattern defines which areas of resist 120 are exposed to the light from source 130. After the exposure, the resist 120 is developed so that some of the resist is removed to uncover the underlying substrate 110. If the resist is "positive", then the resist is removed where it was exposed to the light. If the resist is "negative", the resist is removed where it was not exposed. In either case, the remaining resist and the exposed (uncovered) areas of substrate 110 reproduce the pattern on mask 140. The wafer is then processed as desired (e.g. the exposed areas of substrate 110 can be etched, implanted with dopant, etc.).

The resist pattern on wafer 110 is not always a faithful reproduction of the mask. In FIG. 2, an opaque feature 210M on mask 140 has a concave corner 220M. Feature 210M should ideally be printed (reproduced) in resist 120 as feature 210R, with a corner 220R. In fact, the resist region 230 in the corner's cavity gets underexposed. As a result, the corner is smoothened in the resist pattern, as shown by line 240. See U.S. Pat. No. 6,280,887 issued Aug. 28, 2001 to Lu.

The resist pattern can be corrected with a serif 310 (FIG. 3). The serif is a region cut out in opaque feature 210M to increase the exposure of region 230. However, if the feature 210M is narrow, i.e. the dimensions D1, D2 are small, the serif can be difficult to form on the mask.

SUMMARY

The invention is defined by the appended claims which are incorporated into this section in their entirety. The rest of this section summarizes some features of the invention.

Some embodiments of the present invention provide alternative techniques to reduce underexposure of the resist. In some embodiments, the resist is exposed twice. One exposure is through a mask like in the prior art, for example, as in FIG. 2 or 3. The other exposure is conducted through a different ("modified") mask which exposes resist regions which correspond to opaque regions of the first mask. This "modified" exposure is not conducted with a sufficient light energy dose to create a resist pattern on the wafer. For example, in the case of the positive resist, the modified exposure dose is insufficient to cause the resist to be removed during the developing process. However, the modified exposure increases the total energy dose delivered to regions such as 230. A more faithful pattern reproduction results in some cases.

The modified and non-modified exposures can be performed in any order.

In some embodiments, the modified exposure does not use a mask. The entire resist surface is exposed.

Other features and embodiments are described below.

DESCRIPTION OF PREFERRED EMBODIMENTS

Figure 1:
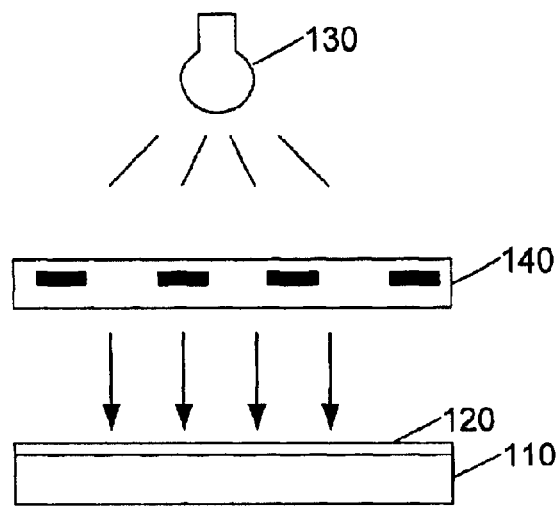
FIG. 1 is a side view illustrating a prior art photoresist exposure system suitable for some embodiments of the present invention.
Figure 2:
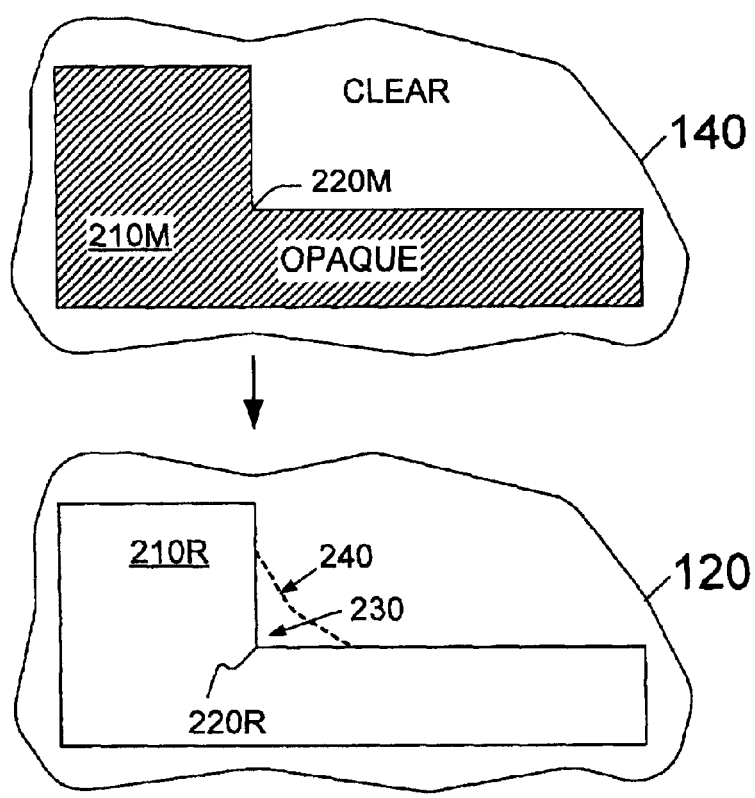
FIG. 2 is plan view of a prior art mask and a corresponding pattern formed in photoresist.
Figure 4:
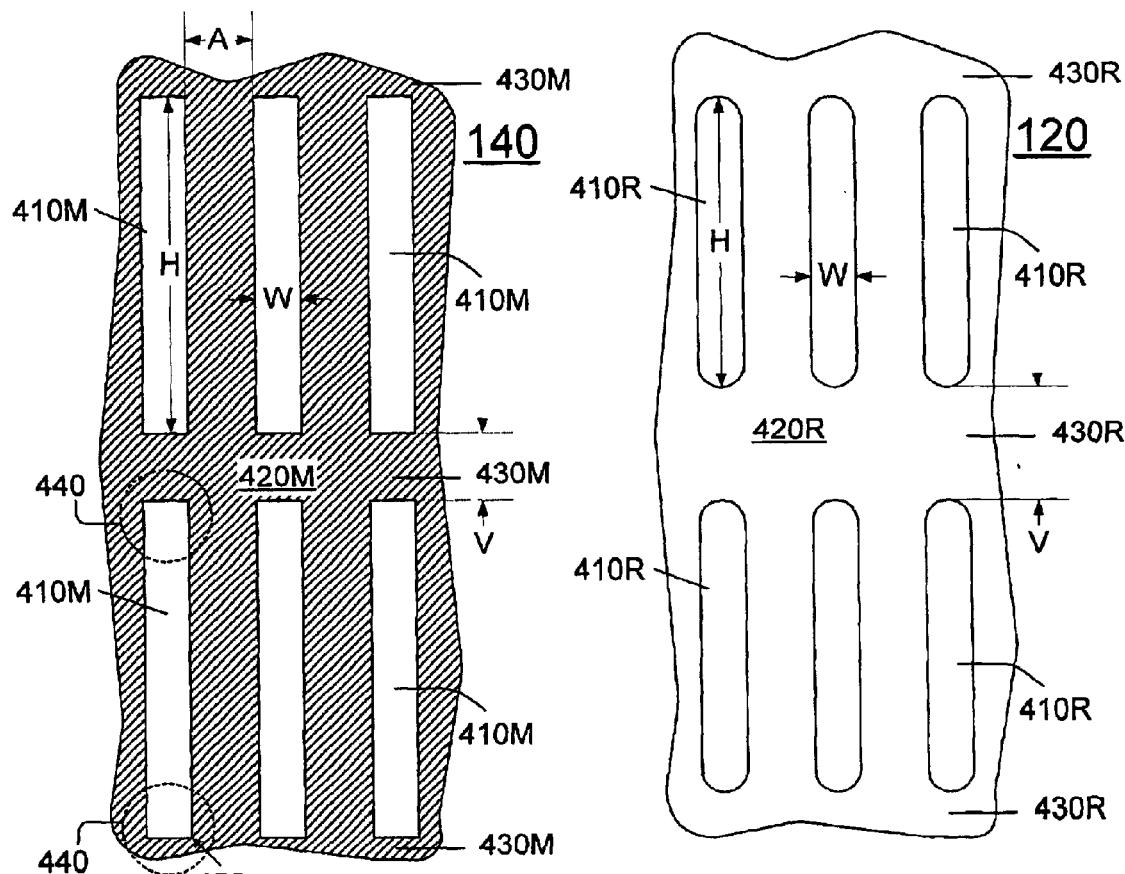
FIG. 4 is a plan view of a mask used in some embodiments of the present invention.

FIG. 4 illustrates an exemplary mask or reticle 140 which will now be used to illustrate some aspects of the invention. (The terms "mask" and "reticle" are used interchangeably herein.) The mask has a number of clear regions 410M surrounded by an opaque region 420M. In one embodiment, the mask was used with a positive resist to define isolation trenches formed in a monocrystalline silicon substrate for a memory array. Exemplary dimensions are as follows. Each clear region 410M is a rectangle of a height H=1.38 $\mu$m and a width W=0.18 $\mu$m. The vertical gaps 430M between the adjacent rectangles 410M have each a height of V=0.22 $\mu$m. Each horizontal gap A is 0.3 $\mu$m. Light source 130 (FIG. 1) is a deep ultraviolet light source (DUV) having a wave length of 248 nm. (The dimensions and other details are given for illustration and are not limiting. Also, in one embodiment, the dimensions were 4 times larger than given above because the mask was used with a projection lens reducing the image on the wafer by a factor of 4.)

Of note, each rectangle 410M has two convex ends 440. Each end 440 defines a cavity in opaque region 420M. Each angle 450 of rectangle 410M also defines a cavity in region 420M.

Figure 5:
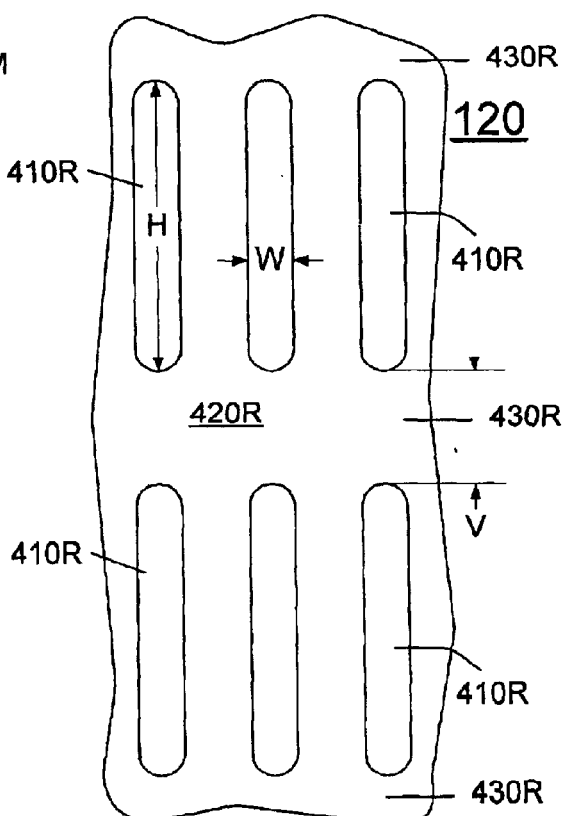
FIG. 5 is a plan view of a resist pattern corresponding to the mask of FIG. 4.

The resist pattern formed on the wafer is shown in FIG. 5. Regions 410R, 420R, 430R correspond to respective mask regions 410M, 420M, 430M. The rectangles 410R are rounded, their height H is reduced, and the width W is increased. In one embodiment using a prior art resist exposure, the vertical gap V was 0.456 $\mu$m in the resist pattern, i.e. more than twice as large as the 0.22 $\mu$m gap on mask 140.

Figure 6:
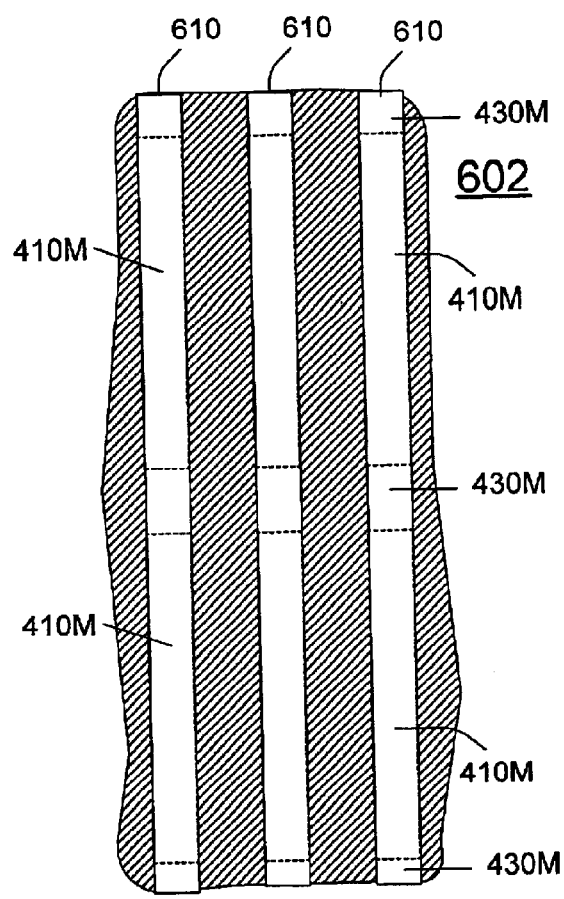
FIGS. 6–10 are plan views of masks used in some embodiments of the present invention.

A more faithful image can be obtained with an additional exposure through a modified mask 602 (FIG. 6). In mask 602, each clear region 610 extends vertically through an area corresponding to an entire column of rectangles 410M (FIG. 4). The positions of the short sides of rectangles 410M are shown by dashed lines. Each region 610 covers the areas corresponding to the rectangles 410M and the vertical gaps 430M in one column. The clear regions 610 do not have cavities at the position of rectangle ends 440 (FIG. 4).

In one embodiment, the resist pattern is formed as follows:

TABLE 1

1. Coat the wafer 110 with a 0.078 $\mu$m layer of antireflective coating (not shown) of type AR2 available from Shipley Company, L.L.C., of Marlborough, Massachusetts. Bake and cool down the wafer. (This is a standard step.)
2. Deposit a 0.0609 $\mu$m layer of a positive photoresist of type UV6 (Trademark) available from Shipley.
3. Expose the wafer through mask 602 of FIG. 6 to ultraviolet light with one half of the dose normally used in prior art. In some embodiments, the exposure is performed with a scanner of type ASML 500 available from ASML. The "best dose" recommended by ASML is 27.5 mJ/cm$^2$, TABLE 1-continued so the exposure at this step occurs with a dose of 13.75 mJ/cm².
This dose is insufficient for the subsequent development step (step 7 below) to remove the resist in the exposed regions and uncover the wafer.
4. Bake and cool down the wafer.
5. Expose the wafer through the mask 140 of FIG. 4 to ultraviolet light with a dose of 13.75 mJ/cm².
6. Bake and cool down the wafer.
7. Develop the resist.

In one embodiment, the resist exposure is conducted with a scanner of type ASML 500 available from ASML of Tempe, Ariz., which uses a 248 nm light source. The resist exposure is performed with the zero and first order illumination and a −0.1 focus. The numerical aperture (NA) of the projection lens is 0.6. It is believed that this embodiment is capable of reducing the height V of the vertical gaps 430R in the resist pattern to about 0.317 $\mu$m.

If the mask 140 features are narrow, creating the modified mask 602 of FIG. 6 can be easier than forming a serif. In particular, if the width W of rectangles 410M is the minimum feature size, the serif would require sub-lithographic dimensions (i.e., smaller than the minimum feature size) but mask 602 can be formed without sub-lithographic features. However, some embodiments of the present invention combine the mask layout of FIG. 4 with serifs. Also, the invention is not limited to the embodiments in which no sub-lithographic features are needed in the modified mask 602.

Removal of gaps 430M in mask 602 eliminates diffraction and light destructive interference at the short sides of rectangles 410M, so better resolution can be obtained.

In some embodiments, the exposure at step 3 of Table 1 is conducted without a mask. In some embodiments, more than two exposures are conducted. For example, the process of Table 1 can be augmented with an additional step of exposing the resist without a mask.

Steps 3 and 5 in Table 1 can be interchanged.

In another embodiment, the width W of rectangles 410M in mask 140 is 0.14 $\mu$m. The exposure through mask 602 is conducted using off-axis illumination. (Off-axis illumination is described in "Handbook of Microlithography, Micromachining, and Microfabrication" edited by P. Rai-Choudhury, vol. 1 (1997), pages 71–73, incorporated herein by reference.) Also, an annular pupil is used to block some of the zero order light. In some embodiments, the rectangles' height H in mask 140 is 0.956 $\mu$m, the gap height V=0.156 $\mu$m, and the horizontal gap width A=0.210 $\mu$m. The width of each feature 610 can be slightly larger than 0.14 $\mu$m to accommodate a possible misalignment between the masks 602 and 140. A 0.16 $\mu$m width dimension can be used.

Figure 3:
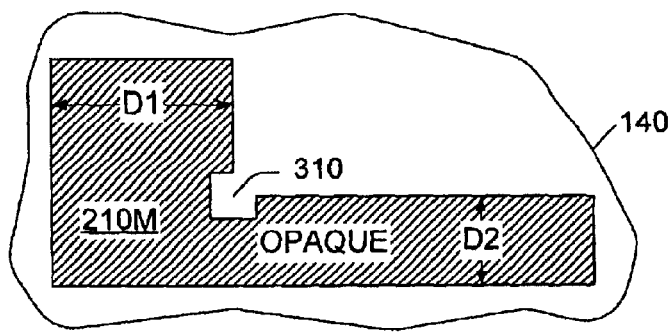
FIG. 3 is a plan view of a prior art mask.
Figure 7:
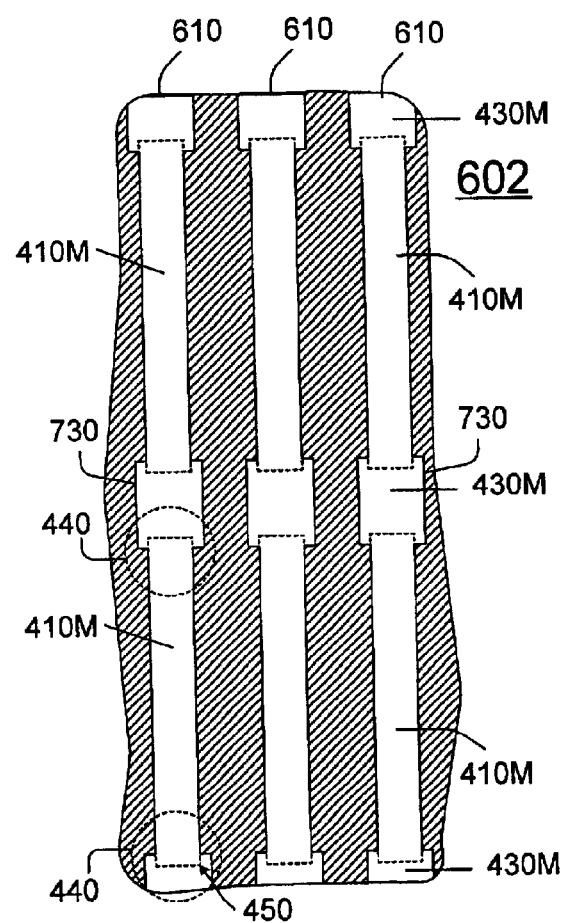

FIGS. 7–10 show alternative designs for mask 602. In FIG. 7, the mask is identical to that of FIG. 6 except that each clear region 610 has a horizontal extension 730 at each gap 430M. Each extension 730 extends horizontally and vertically beyond the corresponding rectangles 410M (i.e. beyond the positions of rectangles 410M on mask 140) in both directions (left and right). Extensions 730 increase the light exposure at corners 450 and alleviate the need for serifs 310 (FIG. 3) in mask 140 at these corners. Serifs 310 are used in some embodiments however.

Figure 8:
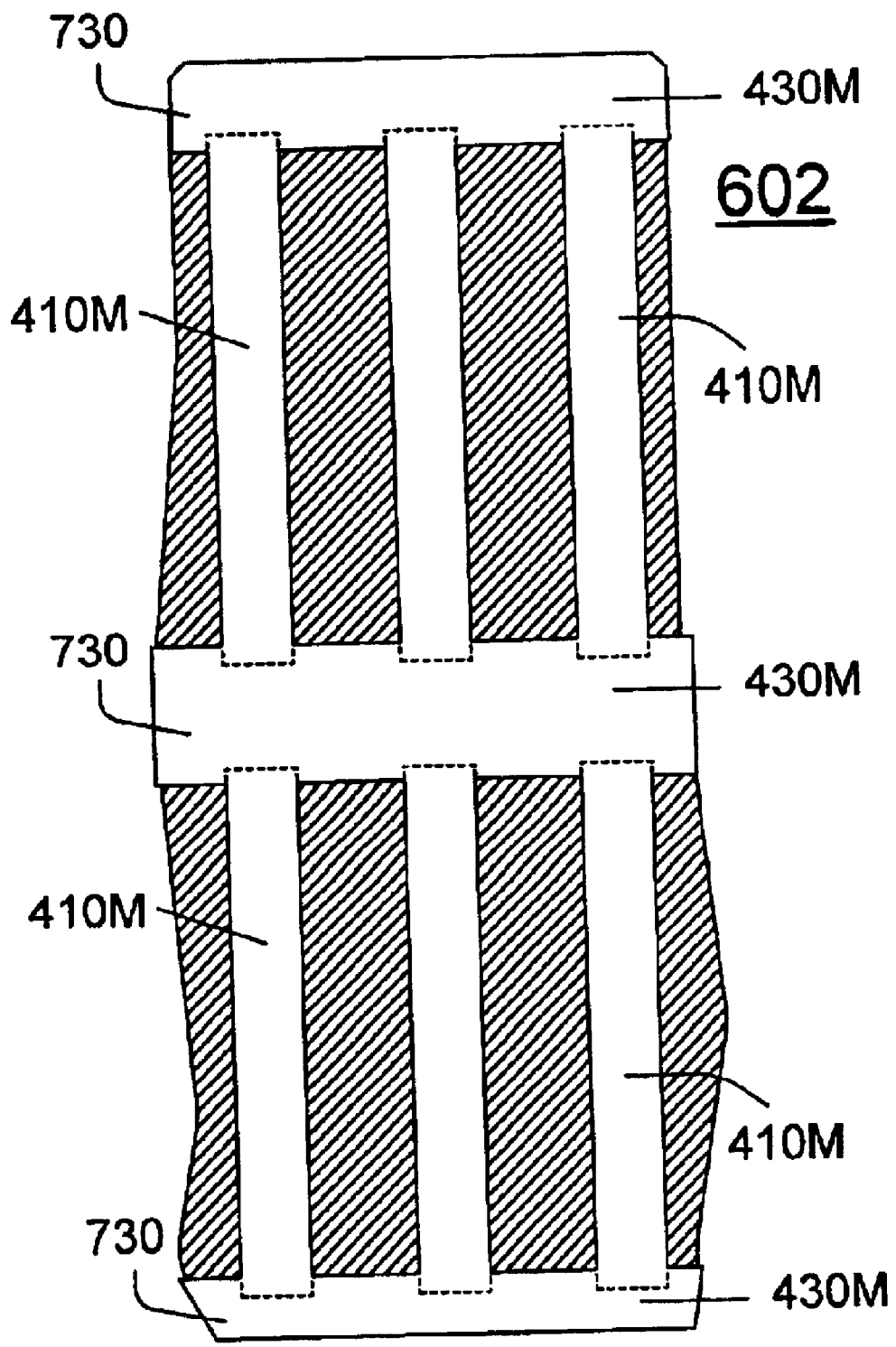

FIG. 8 shows an identical mask except that the extensions 730 are merged into horizontal strips each of which traverses the entire array of rectangles 410M. The strips 730 are greater in height than gaps 430M, so the strips 730 overlap the positions of rectangles 410M. In other embodiments, the strips 730 do not overlap the rectangles.

The mask of FIG. 8 may be easier and faster to write than the mask of FIG. 6. Also, the mask of FIG. 8 advantageously provides higher exposure in gaps 430 (i.e. the areas corresponding to gaps 430M). In addition, compared to FIG. 7, diffraction and destructive light interference at the vertical edges of extensions 730 are eliminated.

Figure 9:
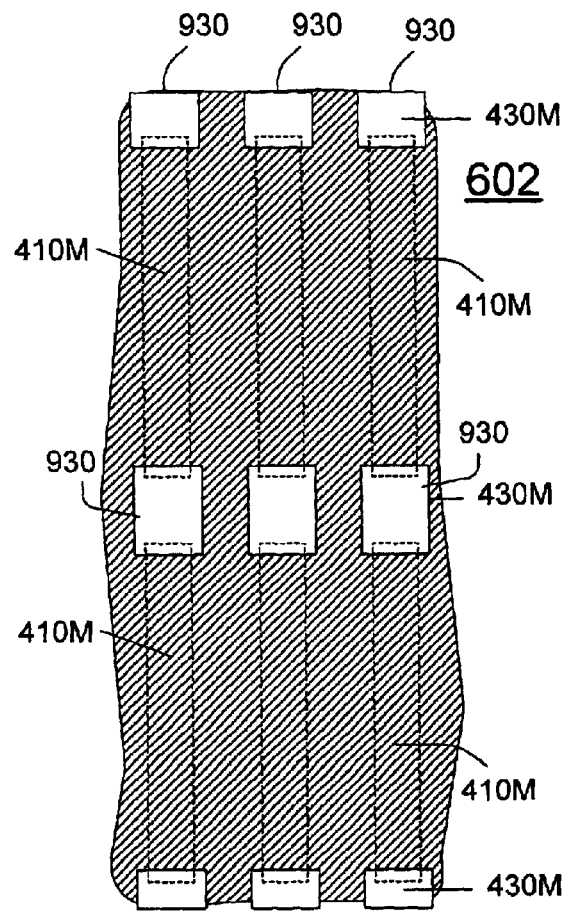

In FIG. 9, the clear region consists of isolated regions 930. Each region 930 covers a gap 430M (FIG. 4) and may extend beyond the gap vertically and/or horizontally, but regions 930 do not cover the rectangles 410M. During the exposure through mask 140, the radiation dose is 100% of the best dose.

This design is advantageous because there may be a slight misalignment (about 20 nm for example) between the masks 602 and 140. This misalignment may reduce the contrast along the long edges of rectangles 410M if these edges are exposed twice (as with the masks of FIGS. 6–8).

With the mask of FIG. 9, the contrast loss is less of a problem, so a higher dose (e.g. more than 50% of the best dose) can be used with mask 602.

Figure 10:
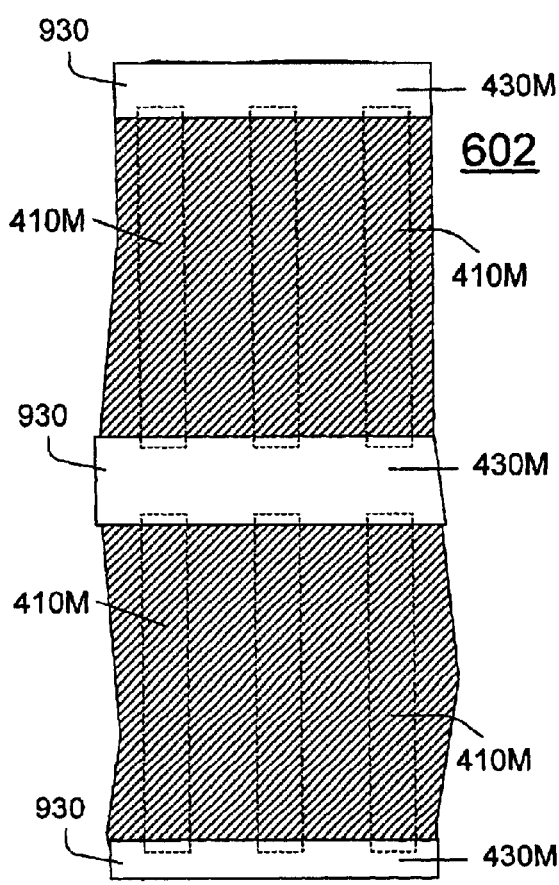

In FIG. 10, regions 930 are merged into strips each of which traverses the array of rectangles 410M and covers one row of gaps 430M. 100% of the best dose is used at step 5 (with mask 140), and more than 50% can be used at step 3. This mask can be faster to write than the mask of FIG. 9. Also, diffraction and destructive light interference are eliminated at the vertical edges of regions 930 compared to FIG. 8.

The above techniques can be combined with other photolithographic techniques. For example, some or all of the opaque regions can be replaced with partially transmitting non-clear regions. See the aforementioned "Handbook of Microlithography, Micromachining, and Microfabrication", volume 1, page 79, incorporated herein by reference. The masks involved can be binary masks, phase shift masks, or other types of masks, known or to be invented. The invention is not limited to any particular mask patterns or dimensions, resist types, exposure doses, wavelengths, or other parameters, or any particular materials or equipment. The invention is not limited to baking and cooling cycles or use of antireflective coatings. The invention is defined by the appended claims.

What is claimed is:

1. A method for processing a layer of material sensitive to radiation, the layer being formed on a substrate, the method comprising:
    irradiating the material with said radiation; and
    developing the material to remove a portion of the material and expose one portion of the substrate but not another portion of the substrate, creating a pattern of the exposed and unexposed portions of the substrate;
    wherein the irradiating operation comprises:
        (a) irradiating said material with said radiation through a first mask, wherein the first mask has a pattern of a clear region and a non-clear region; and
        (b) irradiating said material with said radiation without a mask, or through a second mask which has a clear region at a position of at least a portion of the non-clear region of the first mask, wherein a radiation dose in the operation (b) is insufficient by itself to enable the developing operation to create a pattern with a portion of the substrate exposed and a portion of the substrate not exposed;
    wherein the pattern of the exposed and unexposed portions of the substrate created in the developing operation reproduces the pattern of the clear and non-clear regions of the first mask.

2. The method of claim 1 wherein a radiation dose in the operation (a) is insufficient by itself to modify the material to enable the developing operation to create said pattern of the exposed and unexposed portions of the substrate.

3. The method of claim 1 wherein the material is a positive resist, and the radiation dose in the operation (b) is insufficient by itself to make the resist irradiated in the operation (b) removed in the developing operation.

4. The method of claim 1 wherein the material is a negative resist, and the radiation dose in the operation (b) is insufficient by itself to make the resist irradiated in the operation (b) withstand the resist removal in the developing operation.

5. The method of claim 1 wherein the operation (b) comprises irradiating said material through the second mask which has a non-clear region in addition to the clear region.

6. The method of claim 5 wherein the non-clear region of the first mask has a cavity, and the clear region of the second mask overlaps the position of the non-clear region of the first mask at said cavity.

7. The method of claim 6 wherein the non-clear region of the second mask does not have a cavity at a position of the cavity of the first mask.

8. The method of claim 6 wherein the non-clear region of the first mask has a cavity having a boundary adjacent to the clear region of the first mask, and the clear region of the second mask covers the position of the boundary.

9. The method of claim 5 wherein the clear region of the first mask comprises two clear sub-regions separated by a non-clear gap; and
the clear region of the second mask covers the position of the non-clear gap.

10. The method of claim 5 wherein the second mask is clear at each position at which the first mask is clear.

11. The method of claim 5 wherein the clear region of the second mask does not cover the entire position of the clear region of the first mask.

12. The method of claim 5 wherein the clear region of the first mask comprises a contiguous elongated region surrounded by the non-clear region of the first mask, the contiguous elongated region having a convex end abutting the non-clear region of the first mask; and
the clear region of the second mask overlaps the position of the non-clear region of the first mask at said end, and extends at least to the position of a boundary between said end and the non-clear region of the first mask.

13. The method of claim 12 wherein the clear region of the second mask covers the position of the boundary of said end and extends beyond the position of said boundary transversally to the direction of the elongated region.

14. The method of claim 5 wherein the clear region of the first mask comprises a plurality of contiguous elongated regions surrounded by the non-clear region of the first mask, each elongated region having a convex end abutting the non-clear region of the first mask; and
the clear region of the second mask comprises a contiguous region that overlaps the position of the non-clear region of the first mask and extends at least to the position of each said end.

15. The method of claim 5 wherein the clear region of the second mask covers a position of the clear region of the first mask and extends beyond the position of the clear region of the first mask.

16. A method for processing a layer of material sensitive to radiation, the layer being formed on a substrate, the method comprising:
irradiating the material with said radiation; and
developing the material to remove a portion of the material and expose one portion of the substrate but not another portion of the substrate, creating a pattern of the exposed and unexposed portions of the substrate;
wherein the irradiating operation comprises:
(a) irradiating said material with said radiation through a first mask, wherein the first mask has a pattern of a clear region and a non-clear region; and
(b) irradiating said material with said radiation through a second mask which has a clear region at a position of at least a portion of the non-clear region of the first mask, wherein a radiation dose in the operation (b) is insufficient by itself to enable the developing operation to create a pattern with a portion of the substrate exposed and a portion of the substrate not exposed;
wherein the non-clear region of the first mask has a cavity, and the clear region of the second mask covers the position of an entire boundary between said cavity and the clear region of the first mask.

17. A method for processing a layer of material sensitive to radiation, the layer being formed on a substrate, the method comprising:
irradiating the material with said radiation; and
developing the material to remove a portion of the material and expose one portion of the substrate but not another portion of the substrate, creating a pattern of the exposed and unexposed portions of the substrate;
wherein the irradiating operation comprises:
(a) irradiating said material with said radiation through a first mask, wherein the first mask has a clear region and a non-clear region; and
(b) irradiating said material with said radiation through a second mask which has a clear region at a position of at least a portion of the non-clear region of the first mask, wherein a radiation dose in the operation (b) is insufficient by itself to enable the developing operation to create a pattern with a portion of the substrate exposed and a portion of the substrate not exposed;
wherein the clear region of the first mask comprises two clear sub-regions separated by a non-clear gap; and
the clear region of the second mask covers the position of the non-clear gap and overlaps the two clear sub-regions adjacent to the gap.

18. A method for processing a layer of material sensitive to radiation, the layer being formed on a substrate, the method comprising:
irradiating the material with said radiation; and
developing the material to remove a portion of the material and expose one portion of the substrate but not another portion of the substrate, creating a pattern of the exposed and unexposed portions of the substrate;
wherein the irradiating operation comprises:
(a) irradiating said material with said radiation through a first mask, wherein the first mask has a clear region and a non-clear region, wherein the clear region comprises an array of elongated sub-regions; and
(b) irradiating said material with said radiation through a second mask which has a clear region and a non-clear region, wherein a radiation dose in the operation (b) is insufficient by itself to enable the developing operation to create a pattern with a portion of the substrate exposed and a portion of the substrate not exposed, wherein the clear region of the second mask comprises a plurality of strips, each strip covering the position of a column of the elongated sub-regions of the first mask.

* * * * *